United States Patent [19]

Reichart

[11] Patent Number: 4,672,502

[45] Date of Patent: Jun. 9, 1987

[54] OVERDISSIPATION PROTECTION CIRCUIT FOR A SEMICONDUCTOR SWITCH

[75] Inventor: Elwood C. Reichart, Chicago, Ill.

[73] Assignee: Motorola, Inc., Schaumburg, Ill.

[21] Appl. No.: 703,783

[22] Filed: Feb. 21, 1985

[51] Int. Cl.⁴ .............................................. H02H 9/02
[52] U.S. Cl. ...................................... 361/101; 361/98; 323/276
[58] Field of Search ............... 323/273, 274, 275, 276, 323/282, 284, 286, 289, 901; 361/18, 88, 92, 101, 93

[56] References Cited

U.S. PATENT DOCUMENTS

| | | | |
|---|---|---|---|
| 3,327,201 | 6/1967 | Brantley, Jr. ......................... | 323/277 |
| 3,336,503 | 8/1967 | White ................................... | 361/75 |
| 3,517,264 | 6/1970 | Anderson, Jr. ........................ | 361/59 |
| 3,527,999 | 10/1970 | Weinberger ........................ | 323/286 |
| 3,578,983 | 5/1971 | Kondo .................................. | 361/88 |
| 3,643,151 | 2/1972 | Matsushima et al. ................ | 323/277 |
| 3,654,518 | 4/1972 | Phelps .................................. | 323/282 |
| 3,733,540 | 5/1973 | Hawkins ............................... | 363/89 |
| 3,764,829 | 10/1973 | McDonald et al. ................. | 307/255 |
| 3,786,279 | 1/1974 | Wilson ................................. | 307/254 |
| 4,013,925 | 3/1977 | Tice et al. ............................. | 361/18 |
| 4,040,116 | 8/1977 | Sheldon ................................ | 361/18 |
| 4,161,760 | 7/1979 | Valentine ............................. | 361/18 |
| 4,288,831 | 9/1981 | Dolikian .............................. | 361/92 |
| 4,363,068 | 12/1982 | Burns ................................... | 361/91 |
| 4,423,457 | 12/1983 | Brajder ................................ | 361/86 |

FOREIGN PATENT DOCUMENTS 52-48034  4/1977  Japan .

Primary Examiner—A. D. Pellinen
Assistant Examiner—H. L. Williams
Attorney, Agent, or Firm—Raymond A. Jenski; Rolland R. Hackbart

[57] ABSTRACT

An overdissipation protection circuit for a semiconductor switch is disclosed in which the switch circuit is converted into a relaxation oscillator when the current drawn by the load exceeds a predetermined value. Dissipation in the switch semiconductor is reduced because it remains on only for a brief period of time during the relaxation oscillator cycle. If the current drawn by the load exceeds a second predetermined value, the semiconductor switch is turned off. The protection circuit is automatically reset when the relaxation oscillator reaches an on state and the current drawn by the load does not exceed the predetermined value.

21 Claims, 8 Drawing Figures

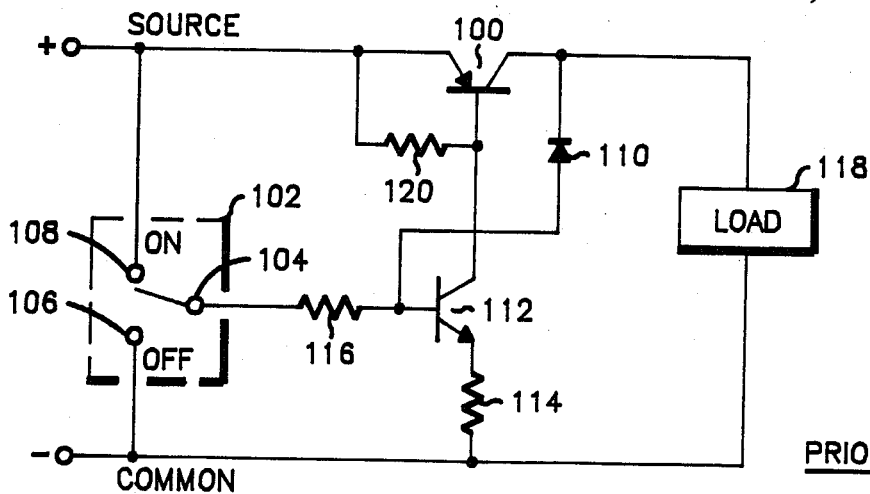
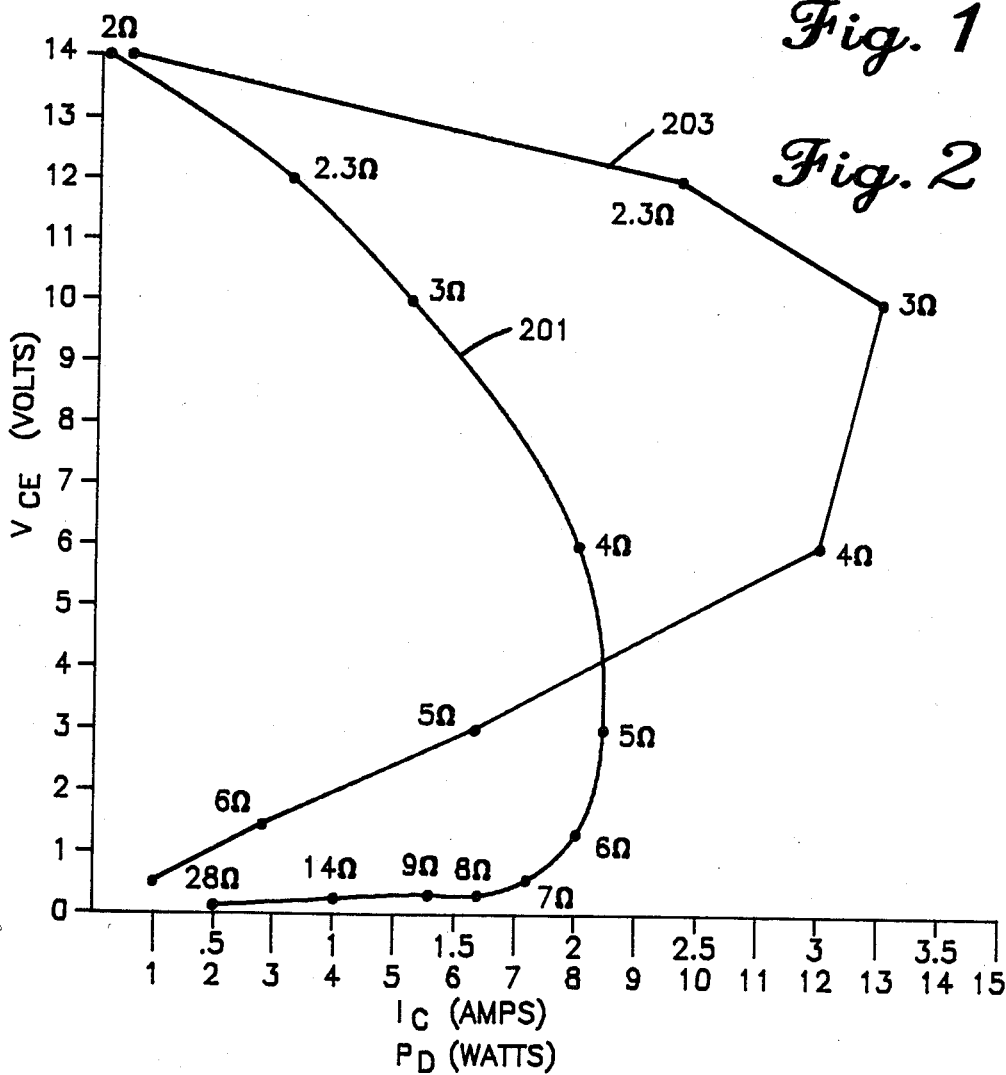
PRIOR ART
*Fig. 1*
*Fig. 2*

4,672,502

OVERDISSIPATION PROTECTION CIRCUIT FOR A SEMICONDUCTOR SWITCH

BACKGROUND OF THE INVENTION

This invention generally relates to semiconductor protection circuitry and more specifically relates to an overdissipation and excessive current protection circuit for a transistor switch which automatically resets if the magnitude of the overdissipation is within a predetermined range when the cause of the overdissipation is removed.

It is often desirable to turn power on and off from a location which is physically remote from the source of power and the power sink. One reason for this is that it is undesirable to run significant current from the source to a location convenient for switching the current and then return the current to the load. A device which requires a small amount of current to switch a large amount of current can perform the remote switching function well.

Transistors are often employed to perform the remote switching function, for they switch relatively large amounts of current with a small control current. Transistors, however, are subject to damage or destruction if their current or power ratings are exceeded.

It has been shown that a field effect transistor (FET) switch can be protected from damage by excessive current by detecting a high drain-source voltage ($V_{DS}$). This voltage may be input to added control circuitry for causing the FET to turn off. This switch may be reset by a capacitor-resistor charging network which cycles the FET on each time it is turned off as a result of excessive current. Protection for damage which may be caused by excessive power dissipation within the FET under near short circuit conditions is unaddressed.

The excessive dissipation damage problem is also commonly encountered in voltage regulator circuits. There, a sample of the current drawn by the load is typically fed back to regulator control circuitry such that upon overload, the current through the regulator is reduced. A short circuit may activate a regulator disable mechanism which protects the regulator and which may be manually or automatically reset.

In the typical voltage regulator protection circuit, a near-short circuit may cause the regulator device to dissipate power in excess of the maximum rated power despite the feedback signal. Circuits devised to fully protect the regulator device against excessive current and power dissipation have generally been complex.

Also, solid state circuit breaker circuits experience excessive current and power conditions. Solid state circuit breakers exist to interrupt current to a load when the current exceeds a predetermined magnitude. This magnitude need not be a short circuit. In order to reset the circuit breaker, an oscillator, which may be activated by a voltage differential across the tripped circuit breaker, is generally provided to generate pulses and cause the circuit breaker to reset. If the cause of the excessive current remains, the circuit breaker again trips and the cycle repeats until the cause is removed. The necessary detect and reset circuitry for present solid state circuit breakers has also been complex.

The present invention addresses the conditions of excessive current drain and overdissipation with a novel and uncomplicated circuit design to protect a semiconductor switch.

SUMMARY OF THE INVENTION

It is, therefore, one object of the present invention to provide protection for a semiconductor switch against excessive power dissipation.

It is a further object of the present invention of the present invention to enable the semiconductor switch to be automatically reset after being protected against excessive dissipation.

It is a further object of the present invention to provide protection for a semiconductor switch against excessive current drain.

It is a further object of the present invention to accomplish the excessive power dissipation protection, automatic reset, and excessive current drain protection with reduced circuit complexity.

These and other objects are achieved by the present invention. This invention is an automatically resetting overdissipation and overcurrent protection circuit for a transistor switch, which in an on state delivers current to a load and in an off state blocks current to a load. When a first predetermined threshold of load current is exceeded, the switch transistor alternates between off and on states. The switch transistor ceases to alternate between states and is held in the off state when a second predetermined threshold of load current, not less than the first threshold, is exceeded.

BRIEF DESCRIPTION OF THE DRAWINGS

FIG. 1 is a schematic diagram of one form of a conventional transistor switch circuit with current foldback.

FIG. 2 is a graph showing collector current and device power dissipation for particular component values of FIG. 1.

DESCRIPTION OF THE PREFERRED EMBODIMENT

Figure 3:
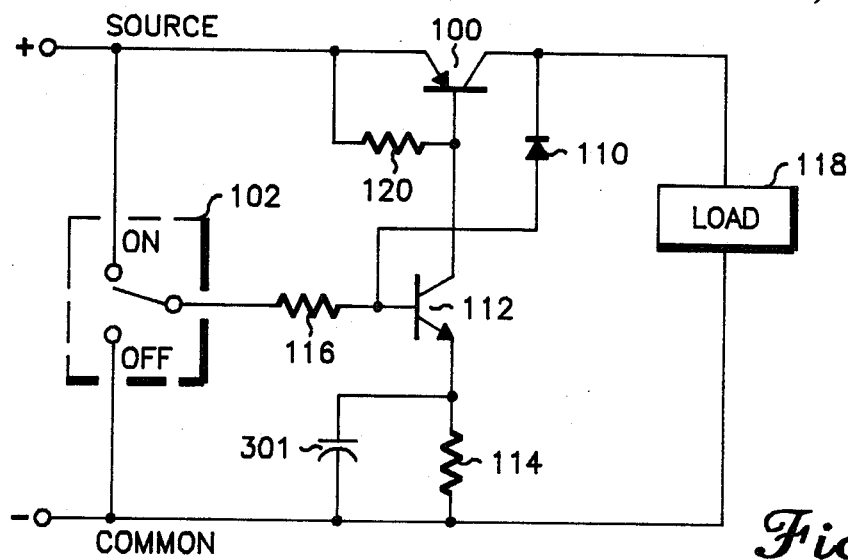
FIG. 3 is a schematic diagram of one form of a transistor switch circuit with current foldback and employing the present invention.

Typical short circuit protection for a transistor switch is shown in FIG. 1. Here, current foldback technology protects a switch transistor 100 from a short circuited output using a reduced number of components and essentially zero current drain from the power supply in the off state. The switch transistor 100 is indirectly controlled by a controlling element which may be shown as switch 102. When the switch 102 is in the "off" position, the common terminal 104 is connected to the power source common via terminal 106. When the switch 102 is in the "on" position the common terminal 104 is connected to the power source positive input via terminal 108.

The load current sensing element for this circuit is the combination of the saturation resistance of switch transistor 100, which is manifested as the collector to emitter saturation voltage, and diode 110. (It will be realized by those of ordinary skill in the art that an emitter follower transistor configuration may successfully perform the function of diode 110). In normal operation, the base of transistor 100 is current starved (by the limitation of base current by resistor 114) causing a forced beta of approximately 30 instead of the usual 10. Switch transistor 100 and driver transistor 112, when "on" are both in full saturation with the drive to the switch transistor 100 determined by resistor 114. The voltage drop across control coupling resistor 116 is approximately 200 millivolts. The collector-emitter saturation voltage of switch transistor 100 is approximately 400 millivolts. Thus, load current sampling diode 110 is slightly forward biased by approximately 200 millivolts and a negligible amount of current is conducted by it. Under an overload condition, the collector emitter saturation voltage across switch transistor 100 increases, thereby causing the collector voltage to drop closer to the common terminal of the power source. This further forward biases diode 110 causing conduction of current through diode 110 and into the load 118. The increased current conducted by diode 110 increases the voltage drop across resistor 116. This IR drop across resistor 116 results in a decrease of voltage across resistor 114 and a reduction of drive current to switch transistor 100. Thus, a positive feedback loop with less than unity gain is formed.

The current passed by switched transistor 100 is dependent upon the amount of overload. In the limit case when the load resistance is zero ohms, the current delivered to the load 118 is approximately equal to the voltage of the source divided by resistor 116 since drive transistor 112 is not quite cut off. The voltage drop across resistor 114 results in only a small current delivered to the base of switch transistor 100 and resistor 120. When resistor 120 is chosen such that the majority of this small current flows through resistor 120, the switch transistor 100 becomes fully cut-off. Thus, the switch transistor 100 is fully protected only for a zero resistance short circuit. Like all current foldback circuits, this circuit has a feedback system arranged such that the output current is directly proportional to the load for all values of load above a predetermined threshold point. That is, after the load current exceeds the threshold, a decrease in load resistance will cause a decrease in load current (but never zero current in the load 118, as this would result in the inability to reset the circuit—"lock-out"—without externally disconnecting the power source. The current conducted by switch transistor 100, however, will go to zero and the load current will be supplied via resistor 116 and diode 110).

The performance of the switch circuit of FIG. 1 is shown in FIG. 2. The particular circuit design employed a TIP42A transistor, available from Motorola, Inc. as the switch transistor 100. A ZTX650 transistor, available from FERRANTI, Inc. was used as driver transistor 112. The diode 110 was a commercially available 1N4001. Resistors 114 and 116 were each 330 ohms and resistor 120 was 390 ohms. The values and specific parts shown in a preferred embodiment of the present invention illustrate one combination selected by the designer; the invention is not to be so limited.

In the graph of FIG. 2, collector to emitter voltage of switch transistor 100 is plotted on the abscissa and collector current (curve 201) is plotted on the ordinate. Also, power dissipation is plotted on the ordinate for curve 203. Tracing curve 201, it can be seen that as the load resistance is reduced from 28 ohms to 2 ohms the current first increases as the load resistance decreases and then decreases as the predetermined current threshold is passed. Curve 203 describes the power dissipation in the switch transistor 100 for the various load resistance ranging from 28 ohms to 2 ohms. It can be seen that the maximum power dissipation occurs when the protection circuity is well into the foldback protection mode. If, for example, the switch transistor 100 had a maximum power dissipation of 10 watts, values of load resistances above 2.3 ohms and below 4.5 ohms would result in excessive power dissipation in of the switch transistor 100 and eventual failure.

This overdissipation is prevented by the present invention. A simplified schematic of the present invention is shown in FIG. 3. Here, a capacitor 301 is introduced in parallel with resistor 114 which causes the alternating current (AC) gain of the current foldback loop of FIG. 1 to have a gain much greater than unity. (The feedback loop of FIG. 1 must have less than unity gain to prevent lock-out in the "off" state. That is, to prevent the protection circuit from latching in the off condition and being unable to reset unless the current source is disconnected). The increase in AC gain with capacitor 301 will have no effect on the normal operations of the circuit below the current threshold. For values of load resistance drawing current at or above the current threshold, the circuit oscillates because the system has positive feedback and greater than unity gain.

Figure 6:
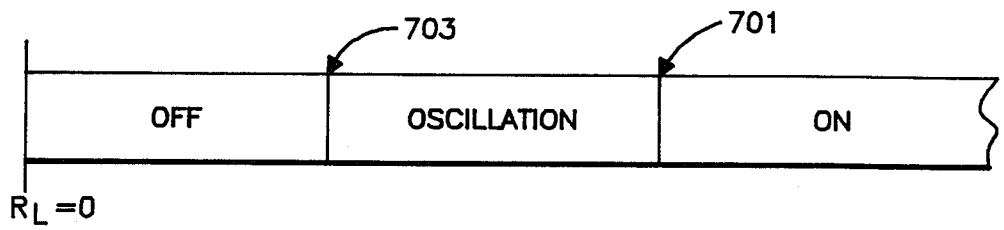
FIGS. 6, 7, and 8 are representations of the modes of operation of a transistor switch protection circuit employing the present invention.

A second threshold may exist for this circuit employing the present invention. Referring to FIG. 6, at a point where the load 118 resistance is just below the predetermined threshold 701, the duty cycle of the oscillation is at a maximum of on time. For increasingly smaller values of resistance, the duty cycle on time becomes increasingly shorter until the oscillation ceases altogether at a second threshold 703. The point of oscillation extinction is a designer's choice and may be varied over wide limits. For example, when the circuit parameters are chosen for oscillation over a wide range of load 118 values, a load 118 resistance of 0.2 ohms will result in a duty cycle of 1 part on for 500 parts off; incrementally lower resistance results in a cessation of oscillation. The circuit parameters may also be chosen such that the predetermined threshold of oscillation and the threshold of oscillation of extinction are equal. In this case, when the value of load 118 resistance causes the threshold current to be drawn, the circuit of the present invention will produce only one-half of a cycle of oscillation thereby turning the switch transistor 100 completely off. When the load 118 resistance increases above the threshold, the remaining one-half cycle of oscillation occurs and the switch transistor 100 is turned on.

Referring again to FIG. 3, the three resistors shown as 114, 116, and 120 each contribute to the determination of the threshold at which oscillation starts. Resistor 114, however, is the primary determinant as it sets the base current drive for switch transistor 100. The smaller the value of resistor 114, the smaller value of load 118 resistance necessary for oscillation to start. Primary control over the oscillation extinction threshold is established by the resistance value of resistor 120 with a secondary effect produced by resistor 116. A decreasing value of resistor 120 results in an increasing value of load 118 resistance for the cessation of oscillation.

Figure 7:
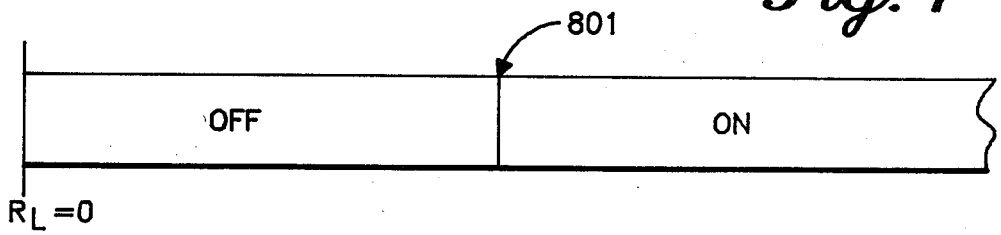

The oscillation threshold may be deleted altogether and the designer may elect to have the current switch off at one threshold shown as threshold 801 in FIG. 7. (The thresholds shown are values of load 118 resistances which result in a particular value of current flowing in the load 118. The word threshold is to be taken to mean either the value of current flowing in the load 118 which results in a particular action being taken or the particular value of load 118 resistance causing the current).

Figure 8:
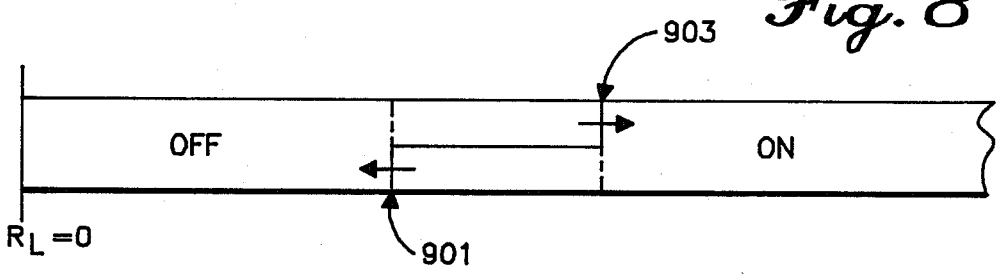

Additionally, a hysteresis effect may be created by causing the circuit to remain off until the current drawn by the load 118 is less than the second threshold. For example, assume normal load current is approximately 1.5 amps. If the load 118 resistance were to be reduced to 7 ohms (approximately 2.0 amps), the diode 110 would conduct and both driver transistor and switch transistor 100 would be cut-off. They will remain in this state as long as the load 118 remains below 8 ohms. If the load 118 resistance increases to a value above 8 ohms but below 9 ohms, the bias of driver transistor 112 becomes such that the transistor is placed in its active region, the switch transistor 100 turns on, and approximately 1.75 amps is delivered to the load 118. Thus, as shown in FIG. 8, the threshold (901) going from an on state to an off state is different (and of a lower load 118 resistance value) than the threshold (903) going from an off state to an on state.

When the circuit is designed for an oscillation state, oscillation occurs as follows. It is assumed that switch 102 is on, switch transistor 100 is saturated, driver transistor 112 is saturated, and capacitor 301 (which in the preferred embodiment is 0.22 microfarads) is charged to the power source voltage minus the emitter-base voltage of transistor 100 and the collector-emitter saturation voltage of transistor 112. The feedback loop is open because diode 110 is held in a minimally conducting state. When the resistance of the load 118 drops below a threshold value and an overload on the output occurs, diode 110 becomes strongly forward biased and the voltage at the base of driver transistor 112 drops because of the voltage drop across resistor 116. The emitter of driver transistor 112, however, is connected to capacitor 301 and therefore cannot instantaneously follow the base voltage because of the capacitor 301 charge. As a result, driver transistor 112 moves toward a non-conducting state which in turn reduces the base current of switch transistor 100. Consequently, switch transistor 100 can no longer support the load current and the positive feedback rapidly drives both driver transistor 112 and switch transistor 100 into the fully cut-off state.

Capacitor 301 discharges through resistor 114 while the transistors 100 and 112 remain in a cut-off state. As the capacitor 301 approaches full discharge, driver transistor 112 reaches a bias condition which brings it into a conducting state. As the driver transistor 112 begins conducting, base current is supplied to switch transistor 100 which causes it to conduct and to supply current to load 118. The base of driver transistor 112 moves in a positive direction and the positive feedback is completed. The capacitor 301 is rapidly recharged (at a rate which may be controlled by a resistor in series with the capacitor 301 but not shown in FIG. 3. This series resistor will protect emitter base junctions from potentially damaging surge currents).

The high charge/recharge current occurring at initial circuit turn on or during oscillation provides switch transistor 100 with the necessary high current base drive for deep transistor saturation preceeding large collector current. Stray load 118 inductance provides a lagging current flow such that transistor saturation occurs before collector current begins to flow. (For example, when the circuit values discussed previously are employed with a 7 ohm wirewound resistor as load 118, the switch transistor 100 was measured to reach saturation in approximately 40 nanoseconds. The collector current in this time was only 4% of the final 2 amp value).

If the overload remains, the cycle will repeat itself automatically until the cause of the overload condition is removed, that is, the circuit will automatically reset. The circuit, comprised of switch transistor 100, diode 110, driver transistor 112, and capacitor 301 functions as a relaxation oscillator with the duty cycle dependent on the amount of overload and the relative values of resistor 120. When the current drawn by the load 118 reaches a high value, the oscillation is stopped and transistor 100 is held in a cut-off state as described previously.

During oscillation, the power dissipation of switch transistor 100 has been greatly reduced for two reasons. First, the "on" time for switch transistor 100 is substantially less than continuously on. Second, during switch transistor 100 "on" time, it is held in deep saturation because of the high base current derived from the rapid recharging of capacitor 301. Therefore according to an important feature of the present invention, under partial short circuit conditions, the power dissipation of switch transistor 100 ranges from near zero to 50% of the normal full load dissipation value because of the time spent in the oscillating "off" condition.

Figure 4:
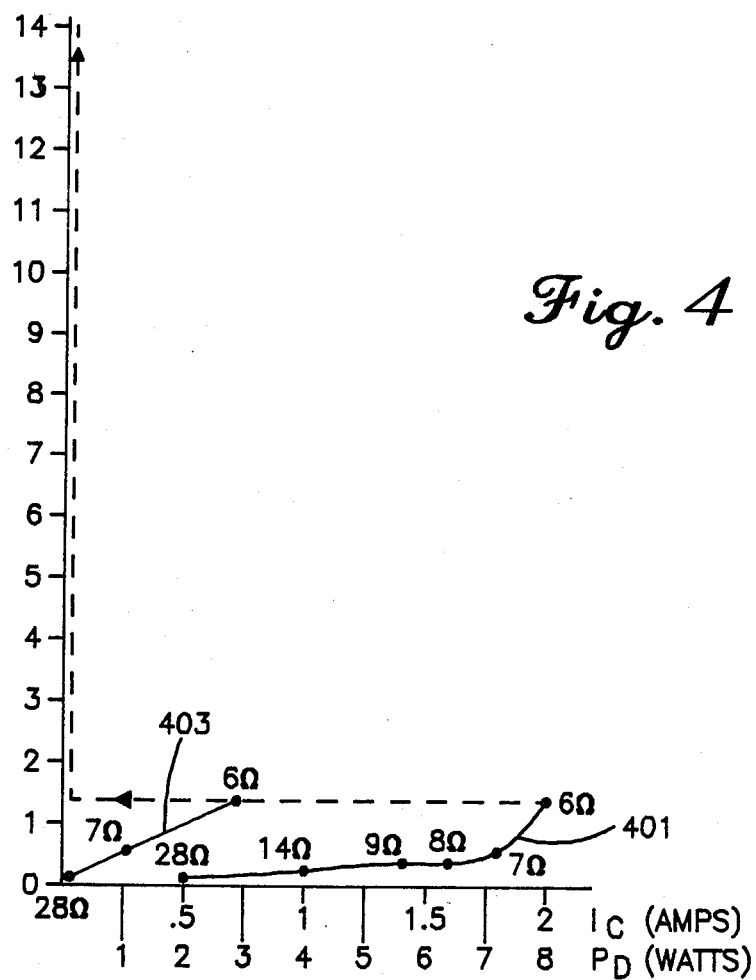
FIG. 4 is a graph showing collector current and device power dissipation for particular component values of FIG. 3.

The performance of switch transistor 100 when the circuit of the present invention is employed is shown in FIG. 4. As the load resistance is decreased from 28 ohms to 6 ohms the relationship (curve 401) of collector-emitter voltage and collector current begins to follow the same curve shape as curve 201 in FIG. 2. Upon reaching a collector current of approximately two amps in the preferred embodiment, the switch transistor 100 is rapidly shut off, as described previously, and the collector-emitter voltage becomes 14 volts (as shown by dotted line). When capacitor 301 has discharged and switch transistor 100 attempts to turn on, it does so at a point of deep saturation as described previously. If the near short circuit cause of the overdissipation remains, the switch transistor 100 is again shut off. If the cause has been removed, the switch transistor 100 remains on at a level of current established by the load 118.

Figure 5:
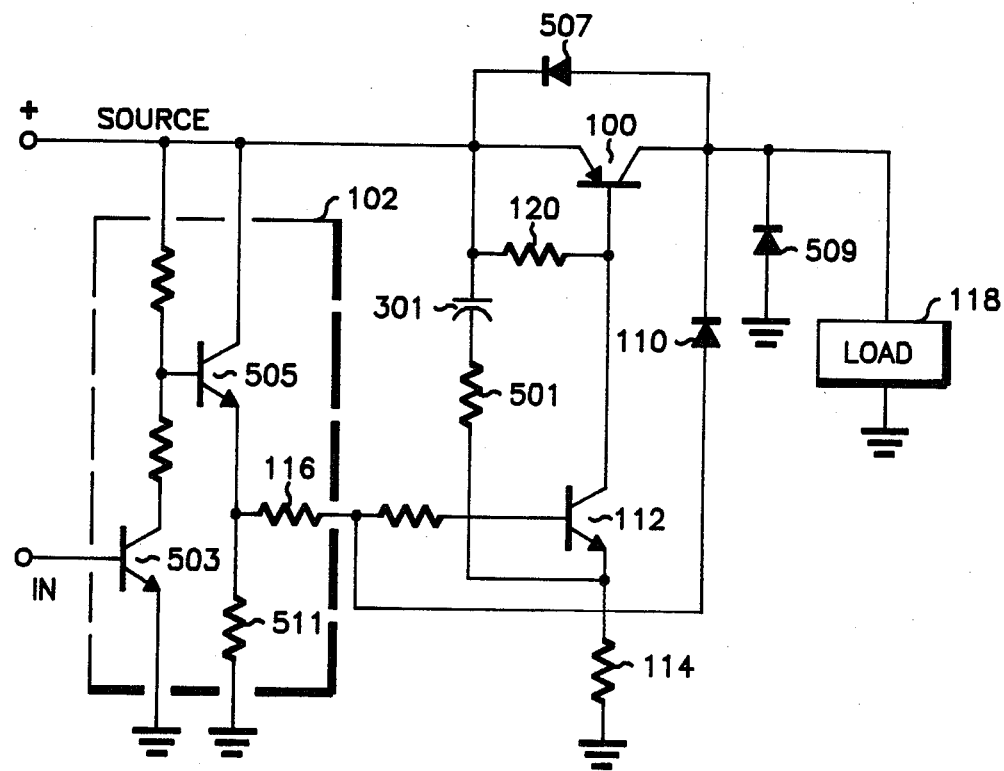
FIG. 5 is a schematic diagram of a transistor switch circuit with current foldback, reverse polarity protection, and employing the present invention.

A switch protection circuit employing the present invention in a preferred embodiment is shown in FIG. 5. In this embodiment, the capacitor 301 is connected to the power source to avoid noise from the power source from being transferred to the base of drive transistor 112 while the emitter was held to a nonvarying ground potential. In the configuration of FIG. 5, power source noise will not cause either predetermined threshold to be falsely exceeded. The bias voltage on the base of driver transistor 112 and the resistor 114 form a variable current source for driving switch transistor 100. In the described implementation of the preferred embodiment, a normal base current of 40 milliamps is provided switch transistor 100 in the steady "on" condition. When switching to the "on" condition (during oscillation or power-up) a peak current of approximately 1.2 amps may be provided for a period in excess of one microsecond. This current peak (via capacitor 301 and resistor 501) forces switch transistor 100 into deep saturation for protection against large initial load 118 current and gives the circuit the ability to drive capacitive loads. The recharging rate of capacitor 301 is determined by resistor 501, which, in the preferred embodiment, is 10 ohms. The switch 102 consists of a transistor switch arrangement employing transistor 505 and resistor 511. Diodes 507 and 509 are installed for three reasons. First, to provide reverse polarity protection for the circuit. Second, to protect the switch transistor 100 from load 118 capacitive discharge in case of a short circuit in the power source. Third to protect the switch transistor 100 from inductive load 118 generated voltages at turn off.

In conclusion, a overdissipation protection circuit for a transistor switch which automatically resets when the cause of the overdissipation is removed has been shown and described. Furthermore, when an excessive amount of current is drawn by a short circuit, the transistor switch may be held in an off condition. The overdissipation protection circuit has a gain greater than unity such that when the current drawn by a load exceeds a predetermined amount, the circuit becomes a relaxation oscillator and the transistor switch is protected by the low duty cycle of oscillation. In cases of solid short circuit load, the oscillation may be stopped and the transistor switch held off. Therefore, while a particular embodiment of the invention has been described and shown, it should be understood that the invention is not limited thereto since many modifications may be made by those skilled in the art. It is, therefore, contemplated to cover by the present application any and all such modifications that fall within the true spirit and scope of the basic underlying principles disclosed and claimed herein.

I claim:

1. An overdissipation and excessive current protection circuit for a switch transistor coupling current from a source to a load in an on state and blocking current to the load in an off state, comprising:
   means for establishing a first predetermined threshold of load current;
   means for establishing a second predetermined threshold of load current not less than said first predetermined threshold;
   means for detecting the exceeding of said first predetermined threshold of load current;
   means for alternating the switch transistor state between off and on states when the exceeding of said first predetermined threshold is detected;
   means for detecting the exceeding of said second predetermined threshold of load current; and
   means for holding the switch transistor in an off state when the exceeding of said second predetermined threshold is detected.

2. An overdissipation and excessive current protection circuit in accordance with claim 1 wherein said means for alternating the switch transistor further comprises a relaxation oscillator circuit configuration.

3. An overdissipation and excessive circuit in accordance with claim 2 wherein said relaxation oscillator further comprises:
   an electrical energy storage element, the switch transistor, a driver transistor, and a diode when the load current is above said first predetermined threshold of load current.

4. An overdissipation and excessive current protection circuit in accordance with claim 3 wherein the switch transistor has an emitter coupled to the source and a collector coupled to the load thereby forming a series-pass switch.

5. An overdissipation and excessive current protection circuit in accordance with claim 4 wherein said driver transistor has its collector coupled to a base of said switch transistor and its emitter coupled through a resistor to a common node.

6. An overdissipation and excessive current protection circuit in accordance with claim 3 wherein said electrical energy storage element is a capacitor.

7. An overdissipation and excessive current protection circuit in accordance with claim 6 further comprising a resistor disposed in series with said capacitor whereby capacitor charging currents may be limited to a finite value.

8. An automatically resetting overdissipation protection circuit with hysteresis for a switch transistor coupling current from a current source to a load comprising:
   a switch transistor having a first terminal coupled to the current source, a second terminal coupled to the load, and a third terminal coupled through a first resistance to said first terminal;
   a driver transistor having a first terminal coupled to said third terminal of said switch transistor, a second terminal coupled through a second resistance to a common node, and a third terminal coupled to a third resistance for positively biasing said driver transistor;
   a diode having a first terminal coupled to said second terminal of said switch transistor and a second terminal coupled to said third terminal of said driver transistor to couple load current in excess of a first predetermined amount to said driver transistor thereby detecting the exceeding of said load current in excess of said first predetermined amount;
   an electrical energy storage element coupled between said second terminal of said driver transistor and the power source whereby said switch transistor may be alternated between off and on states when said detection of load current in excess of said first predetermined amount occurs; and
   a resistor coupled between said first terminal and said third terminal of said switch transistor whereby a load current in excess of a second predetermined amount may be detected and said switch transistor maintained in an off condition.

9. An automatically resetting overdissipation protection circuit with hysteresis in accordance with claim 8 wherein said switch transistor has the emitter coupled to the power source and the collector coupled to the load thereby forming a series-pass switch.

10. An automatically resetting overdissipation protection circuit with hysteresis in accordance with claim 9 wherein said driver transistor has its collector coupled to the base of said switch transistor and its emitter coupled through said resistor to said common node.

11. An automatically resetting overdissipation protection circuit with hysteresis in accordance with claim 8 wherein the common node is a current source common terminal.

12. An automatically resetting overdissipation protection circuit with hysteresis in accordance with claim 8 further comprising a control signal coupled to said driver transistor third terminal whereby said switch transistor may be turned on or off.

13. An automatically resetting overdissipation protection circuit with hysteresis in accordance with claim 8 wherein said electrical energy storage element is a capacitor.

14. An automatically resetting overdissipation protection circuit with hysteresis in accordance with claim 13 further comprising a fourth resistance disposed in series with said capacitor whereby capacitor charging currents may be limited to a finite value.

15. An automatically resetting overdissipation protection circuit with hysteresis for a switch transistor switchably delivering current from a power source to a load comprising:
 a switch transistor having a first terminal coupled to the power source, a second terminal coupled to the load, and a third terminal coupled through a first resistance to said first terminal;
 a driver transistor having a first terminal coupled to said third terminal of said switch transistor, a second terminal coupled through a second resistance to a common node, and a third terminal coupled to a third resistance for positively biasing said driver transistor;
 a diode having a first terminal coupled to said second terminal of said switch transistor and a second terminal coupled to said third terminal of said driver transistor to couple load current in excess of a first predetermined amount to said driver transistor thereby detecting the exceeding of said load current in excess of said first predetermined amount;
 an electrical energy storage element coupled between said second terminal of said driver transistor and the common node whereby said switch transistor may be alternated between off and on states when said detector of load current in excess of said first predetermined amount occurs; and
 a resistor coupled between said first terminal and said third terminal of said switch transistor whereby a load current in excess of a second predetermined amount may be detected and said switch transistor maintained in an off condition.

16. An automatically resetting overdissipation protection circuit with hysteresis in accordance with claim 15 wherein said switch transistor has the emitter coupled to the power source and the collector coupled to the load thereby forming a series-pass switch.

17. An automatically resetting overdissipation protection circuit with hysteresis in accordance with claim 16 wherein said driver transistor has its collector coupled to the base of said transistor and its emitter coupled through said resistor to said common node.

18. An automatically resetting overdissipation protection circuit with hysteresis in accordance with claim 15 wherein the common node is a power source common terminal.

19. An automatically resetting overdissipation protection circuit with hysteresis in accordance with claim 15 further comprising a control signal coupled to said driver transistor third terminal whereby said switch transistor may be turned on or off.

20. An automatically resetting overdissipation protection circuit in accordance with claim 15 wherein said electrical energy storage element is a capacitor.

21. A method for protecting a switch transistor coupling current from a source to a load in an on state and blocking current to a load in an off state against overdissipation and excessive current, comprising the steps of:
 detecting the exceeding of a first predetermined threshold of load current;
 alternating the switch transistor state between off and on states when the exceeding of said first predetermined threshold is detected;
 detecting the exceeding of a second predetermined threshold of load current not less than said first threshold; and
 holding the switch transistor in an off state when the exceeding of said second predetermined threshold is detected.

* * * * *